United States Patent
Szoke et al.

(10) Patent No.: US 9,182,437 B2
(45) Date of Patent: Nov. 10, 2015

(54) METHOD AND CIRCUIT ASSEMBLY FOR THE DIAGNOSIS OF A LOAD PATH IN A VEHICLE

(75) Inventors: Szilard Szoke, Budapest (HU); Zoltan Kosznai, Budapest (HU); Istvan Fater, Budapest (HU)

(73) Assignee: Robert Bosch GmbH, Stuttgart (DE)

( * ) Notice: Subject to any disclaimer, the term of this patent is extended or adjusted under 35 U.S.C. 154(b) by 319 days.

(21) Appl. No.: 13/807,374

(22) PCT Filed: Jun. 27, 2011

(86) PCT No.: PCT/EP2011/060706
§ 371 (c)(1),
(2), (4) Date: Mar. 11, 2013

(87) PCT Pub. No.: WO2012/000931
PCT Pub. Date: Jan. 5, 2012

(65) Prior Publication Data
US 2013/0162261 A1     Jun. 27, 2013

(30) Foreign Application Priority Data
Jul. 1, 2010 (DE) .......................... 10 2010 030 826

(51) Int. Cl.
G01R 31/02 (2006.01)
G01R 31/00 (2006.01)

(52) U.S. Cl.
CPC ............ *G01R 31/006* (2013.01); *G01R 31/025* (2013.01)

(58) Field of Classification Search
CPC ............................ G01R 31/025; G01R 31/006
USPC ............................ 324/503, 510, 512, 87, 119; 702/183–185
See application file for complete search history.

(56) References Cited

U.S. PATENT DOCUMENTS

| | | | |
|---|---|---|---|
| 4,042,967 A | * | 8/1977 | Yamamoto ...................... 361/45 |
| 6,130,530 A | | 10/2000 | McNulty |

(Continued)

FOREIGN PATENT DOCUMENTS

| | | |
|---|---|---|
| DE | 4112996 | 10/1992 |
| DE | 4112996 A1 * | 10/1992 |

(Continued)

OTHER PUBLICATIONS

Kosak Functional monitor for electrical load controlled by switch—measures voltage and/or current of control line by fault identification circuit when fault detection circuit is activated, Oct. 22, 1992, DE, A1.*

(Continued)

*Primary Examiner* — Patrick Assouad
*Assistant Examiner* — Taqi Nasir
(74) *Attorney, Agent, or Firm* — Michael Best & Friedrich LLP

(57) ABSTRACT

A method and circuit assembly for the diagnosis of a load path in a vehicle. The load path comprises a DC voltage source, a switchable load permanently connected to a negative pole and a load switch permanently connected to a positive pole, controlled by a load control signal, wherein in the closed state of the load switch a load current can be conducted through the switchable load (34). During diagnosis a test current having a defined level is generated and is output to the switchable load in accordance with a test control signal via a test switch on an output terminal, wherein a resulting voltage is detected, processed and evaluated at the output terminal, wherein the load switch (36) is opened during the diagnosis, and wherein at least two different diagnostic cases are generated via the test control signal and the resulting switching state of the test switch.

12 Claims, 9 Drawing Sheets

(56) References Cited

U.S. PATENT DOCUMENTS

| | | | |
|---|---|---|---|
| 2004/0104691 A1* | 6/2004 | Lott | 315/224 |
| 2009/0174413 A1 | 7/2009 | Bucella et al. | |
| 2009/0309607 A1* | 12/2009 | Arndt et al. | 324/522 |
| 2011/0016973 A1* | 1/2011 | Hamatani et al. | 73/514.29 |

FOREIGN PATENT DOCUMENTS

| | | |
|---|---|---|
| DE | 4338462 | 5/1995 |
| DE | 4432301 | 3/1996 |
| DE | 19644181 | 4/1998 |
| DE | 10336973 | 3/2005 |
| DE | 102004049906 | 5/2006 |
| DE | 102006045308 | 3/2008 |
| EP | 0752592 | 1/1997 |
| EP | 2347932 | 7/2011 |
| JP | 9218233 | 8/1997 |
| WO | 2007007111 | 1/2007 |

OTHER PUBLICATIONS

International Search Report for Application No. PCT/EP2011/060706 dated Oct. 13, 2011 (3 pages).

* cited by examiner

METHOD AND CIRCUIT ASSEMBLY FOR THE DIAGNOSIS OF A LOAD PATH IN A VEHICLE

BACKGROUND OF THE INVENTION

The invention is based on a method for diagnosis on a load path in a vehicle and on a circuit arrangement for diagnosis on a load.

Electronic controllers are known generally for controlling a wide variety of functions and devices and are increasingly being used in the automotive sector for the purpose of controlling a wide variety of functions and/or applications in a motor vehicle. An important class of such functions and/or applications has what are known as "low-side load circuits", wherein a first connection of such load circuits is permanently connected to a negative pole of a vehicle battery or to the vehicle bodywork and a second connection of the load circuits is switched by an electronic controller. By way of example, the load circuits comprise solenoid valves, electromechanical relays, electric motors, etc. Typically, these load circuits are switched by means of a load switch, which is also called "high-side switch", the first connection of which is permanently connected to a positive pole of the vehicle battery and the second connection of which is connected to the second connection of the load circuit. In the automotive sector, it is customary to perform a diagnosis before the load circuit is activated. The diagnosis is important particularly when the load circuit is arranged outside the electric controller and is connected to the latter by means of electrical lines. By way of example, the diagnosis is meant to recognize shorted or broken lines, nonconnected cables, etc. These cases of error need to be distinguished from the normal circuit situation. A misdiagnosis in the case of a shorted load circuit can result in triggered or blown fuses, malfunctions in the electronic controller or thermal damage, for example. Depending on the specific function and/or application, the diagnosis on the load circuit may be a simple or complex task. One frequently used approach involves a high-value pull-up resistor being looped into the line and the voltage being monitored. Depending on the voltage which is sensed by the electronic controller, it is possible to determine the state of the load circuit. If the sensed voltage exceeds a prescribed threshold value when the load switch is open, for example, it is possible to infer that the load circuit is not connected. Low-resistance load circuits are very difficult for diagnosis, since the nominal value of the load resistance corresponds almost to a nonreactive resistance value in the case of a typical short circuit. The aforementioned approach is therefore unable to distinguish between a shorted line and a normal operating state.

SUMMARY OF THE INVENTION

By contrast, the method according to the invention for diagnosis on a load path in a vehicle has the advantage that during the diagnosis a switchable test current having a defined level is produced and is output to the switchable load via a test switch at an output connection on the basis of a test control signal, wherein a resultant voltage at the output connection is sensed, conditioned and evaluated, wherein the load switch is opened during the diagnosis, and wherein the test control signal and the resultant switching state of the test switch are used to produce at least two different diagnosis cases. The load path comprises a DC voltage source, a switchable load that is permanently connected to a negative pole and a load switch that is permanently connected to a positive pole and that can be controlled by means of a load control signal, wherein in the closed state of the load switch a load current is carried by the switchable load. The method according to the invention can be implemented easily and quickly particularly in an electrical controller having a microprocessor.

The circuit arrangement according to the invention for diagnosis on a load path in a vehicle, particularly for carrying out the method according to the invention, comprises at least one test voltage source, which comprises a voltage source and a test switch controlled by a test control signal and is embodied such that during the diagnosis it is possible for at least one test resistance to be used to produce a test current having a defined level and to output said test current to the switchable load at an output connection, and a signal conditioning unit which, during the diagnosis, senses a resultant voltage at the output connection and outputs conditioned test voltage to an evaluation and control unit for the purpose of evaluation, wherein the load switch is open during the diagnosis, and wherein the test control signal and the resultant switching state of the test switch can be used to produce at least two different diagnosis cases.

Embodiments of the present invention advantageously allow a nominal load, i.e. an error-free load, a short between the output connection and positive pole of the DC voltage source, a short between the output connection and the negative pole of the DC voltage source or an open load or a broken connecting cable to be distinguished from one another and recognized as diagnosis results during the diagnosis on the load path.

The switchable test current allows the aforementioned diagnosis results to be advantageously distinguished for load circuits which have an essentially nonreactive response. The various diagnosis cases may advantageously comprise static and dynamic diagnosis cases, with the static diagnosis cases being able to be used to distinguish and safely recognize a broken line, i.e. a nonconnected load, or a short between the output connection and the positive pole of a DC voltage source even in the case of an inductive load having a low nonreactive resistance. However, it is not possible to use the static diagnosis cases to distinguish between a short between the output connection and the negative pole of the DC voltage source and a nominal load in the case of such an inductive load having a low nonreactive resistance. Such distinction is advantageously made possible by the dynamic diagnosis cases, since the ascertainment of a frequency response or a step response of the inductive load having a low nonreactive resistance can be used to safety recognize and distinguish a normal response of the load and a short circuit between the output connection and the negative pole or the vehicle bodywork.

The measures and developments presented allow advantageous improvements of the method for diagnosis on a load path in a vehicle and of the circuit arrangement for diagnosis on a load path.

It is particularly advantageous that in a first static diagnosis case the resultant voltage at the output connection is sensed when the test switch is open, and the corresponding conditioned test voltage is evaluated, and in a second static diagnosis case the resultant voltage at the output connection is sensed when the test switch is closed, and the corresponding conditioned test voltage is evaluated, wherein the conditioned test voltage is only ever evaluated after a prescribed period of time in the steady state has elapsed.

In one advantageous refinement of the method according to the invention, in a first dynamic diagnosis case the test switch is changed over between a closed and an open switching state by the test control signal at a prescribed frequency, and the resultant voltage at the output connection is sensed and the corresponding conditioned test voltage is evaluated for the purpose of ascertaining the frequency response of the switchable load at the output connection. Alternatively, in a second dynamic diagnosis case the test switch can be closed and opened at least once within a prescribed period of time, wherein the resultant voltage at the output connection is sensed and the corresponding conditioned test voltage is evaluated within the prescribed period of time for the purpose of ascertaining the step response behavior of the switchable load at the output connection.

In a further advantageous refinement of the method according to the invention, a short circuit between the positive pole of the DC voltage source and the output connection of the switchable load can be recognized when the corresponding conditioned test voltage has a high level in the first static diagnosis case and in the second static diagnosis case. In addition, an open switchable load can be recognized when the corresponding conditioned test voltage has different levels in the first static diagnosis case and in the second static diagnosis case. Furthermore, a short circuit between the negative pole of the DC voltage source and the output connection of the switchable load or a nominal inductive switchable load can be recognized but not distinguished when the corresponding conditioned test voltage has a low level in the first static diagnosis case and in the second static diagnosis case. A nominal inductive switchable load can be recognized when the corresponding conditioned test voltage has a high level in the first dynamic diagnosis case or when the corresponding conditioned test voltage has a positive pulse in the second dynamic diagnosis case following the closure of the test switch within the prescribed period of time. A short circuit between the negative pole of the DC voltage source and the output connection of the switchable load can be recognized when the corresponding conditioned test voltage has a low level in the first dynamic diagnosis case or when the corresponding conditioned test voltage has a low level in the second dynamic diagnosis case during the prescribed period of time irrespective of the switching state of the test switch.

In one advantageous refinement of the circuit arrangement according to the invention, the signal conditioning unit has a voltage divider with a low-pass filter response for the purpose of performing a static diagnosis, which allows simple and inexpensive implementation of the signal conditioning unit. By way of example, the low-pass filter response can be attained by means of a capacitor which is arranged in parallel with the output resistor of the voltage divider.

In a further advantageous refinement of the circuit arrangement according to the invention, the signal conditioning unit has a rectifier for the purpose of performing a dynamic diagnosis. By way of example, the rectifier comprises a diode and a smoothing capacitor. In order to match the conditioned voltage to downstream assemblies, the signal path downstream of the rectifier may contain a voltage divider.

In a further advantageous refinement of the circuit arrangement according to the invention, the signal conditioning unit has a voltage divider for the purpose of performing a combined static and dynamic diagnosis, wherein a coupling capacitor is arranged in parallel with a first resistor of the voltage divider, which resistor is connected to the output connection, and wherein the signal path downstream of the voltage divider contains a low-pass filter. Furthermore, the evaluation and control unit performs first the static diagnosis and then the dynamic diagnosis on the at least one load path.

In a further advantageous refinement of the circuit arrangement according to the invention, the at least one test resistance and the resistances in the signal conditioning unit are attuned to one another such that the test current does not exceed a prescribed threshold value in order to prevent the switchable load from being activated. This advantageously makes it possible to prevent an electrical relay from picking up and an associated switching contact from being closed.

Exemplary embodiments of the invention are shown in the drawings and they are explained in more detail in the description below.

DETAILED DESCRIPTION

Figure 1:
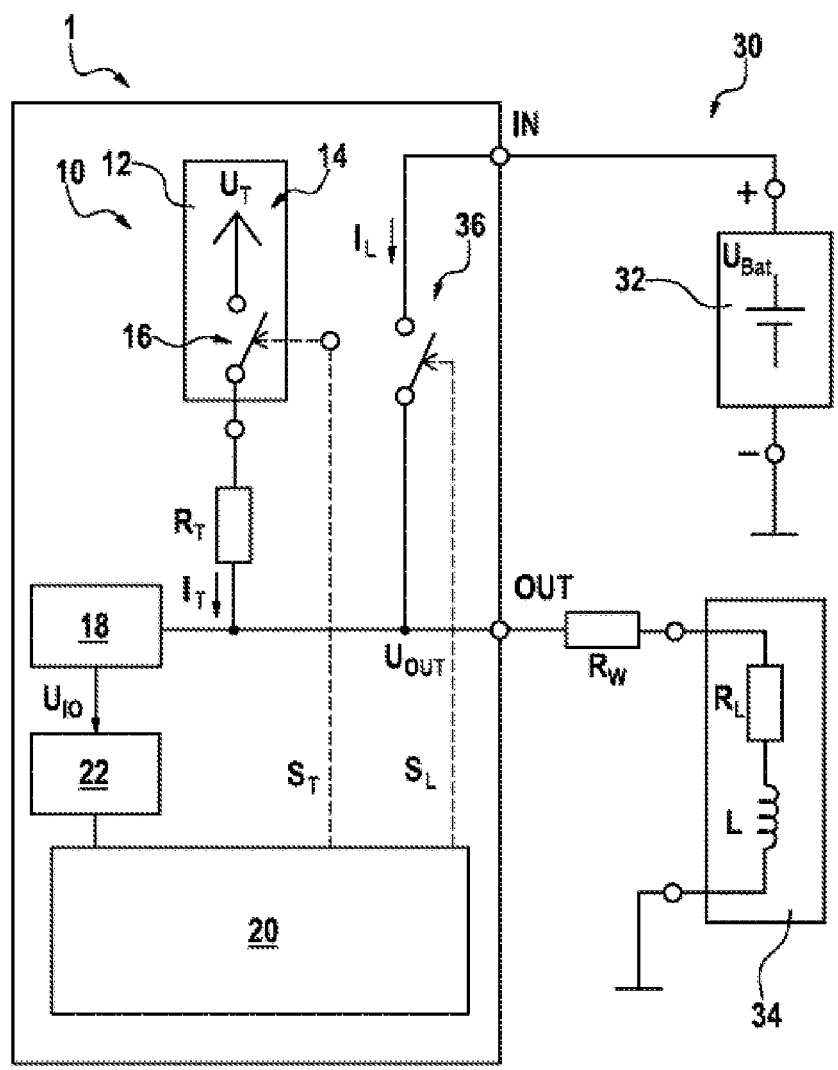
FIG. 1 shows a schematic block diagram of an exemplary embodiment of a circuit arrangement according to the invention for diagnosis on a load path.

As can be seen from FIG. 1, a load path 30 in a vehicle comprises a DC voltage source 32, a switchable load 34 that is permanently connected to a negative pole (−) of the DC voltage source 32 and a load switch 36 that is permanently connected to a positive pole (+) of the DC voltage source 32 and that is arranged within an electronic controller 1 between an input connection IN and an output connection OUT and can be controlled by means of a load control signal $S_L$ which is produced and output by an evaluation and control unit 20 in the electronic controller 1. In the closed state of the load switch 36, a load current $I_L$ can be carried by the switchable load 34. In the exemplary embodiment shown, the switchable load 34 is as an equivalent circuit for an inductive load, such as an electrical relay coil, a solenoid valve, an electric motor, etc., with an ideal inductance L, which is higher than 100 μH, and a low nonreactive resistance $R_L$, which is lower than 10Ω. The resistance $R_W$, which is likewise lower than 10Ω and is looped in between the switchable load 34 and the output connection OUT, takes account of the resistive losses from the lines, connections, etc.

According to the invention, a circuit arrangement 10 for diagnosis on the load path 30 comprises at least one test voltage source 12, which has a voltage source 14 and a test switch 16 controlled by a test control signal $S_T$ and is embodied such that a test current $I_T$ having a defined level can be produced from a test voltage $U_T$ from the voltage source 14 during the diagnosis via at least one test resistance $R_T$ and can be output to the switchable load 34 at the output connection OUT, and a signal conditioning unit 18 which, during the diagnosis, senses a resultant voltage $U_{OUT}$ at the output connection OUT and outputs a conditioned test voltage $U_{IO}$ to the evaluation and control unit 20 for the purpose of evaluation. During the diagnosis, the load switch 36 is open, which means that no load current $I_L$ flows through the switchable load 34. The test control signal $S_T$ and the resultant switching state of the test switch 16 can advantageously be used to produce at least two different diagnosis cases. Arranged between the signal conditioning unit 18 and the evaluation and control unit 20 is an interface unit 22 which may comprise a simple logic input on a microprocessor or an analog/digital converter. By way of example, the test switch 16 may be in the form of a bipolar transistor, a field effect transistor, a relay, etc. The voltage source 14 is preferably in the form of a DC voltage source, with appropriate actuation of the test switch 16 by means of the test control signal $S_T$ making it a simple matter to produce an essentially square-wave AC voltage. The differential nature of the R-L circuit comprising the ideal inductance L and the resistances $R_L$, $R_W$ produce, for a respective square-wave pulse, a corresponding positive voltage pulse on the rising edge of the square-wave pulse and a corresponding negative voltage pulse on the falling edge of the square-wave pulse at the output connection OUT. For the dynamic diagnosis, it is possible to use one or more square-wave pulses, as explained below. In addition, during the diagnosis, it is possible for a plurality of measurements to be taken for each load path and for the results to be averaged and/or rated in order to improve the reliability of the circuit arrangement according to the invention and the method according to the invention.

Figure 2:
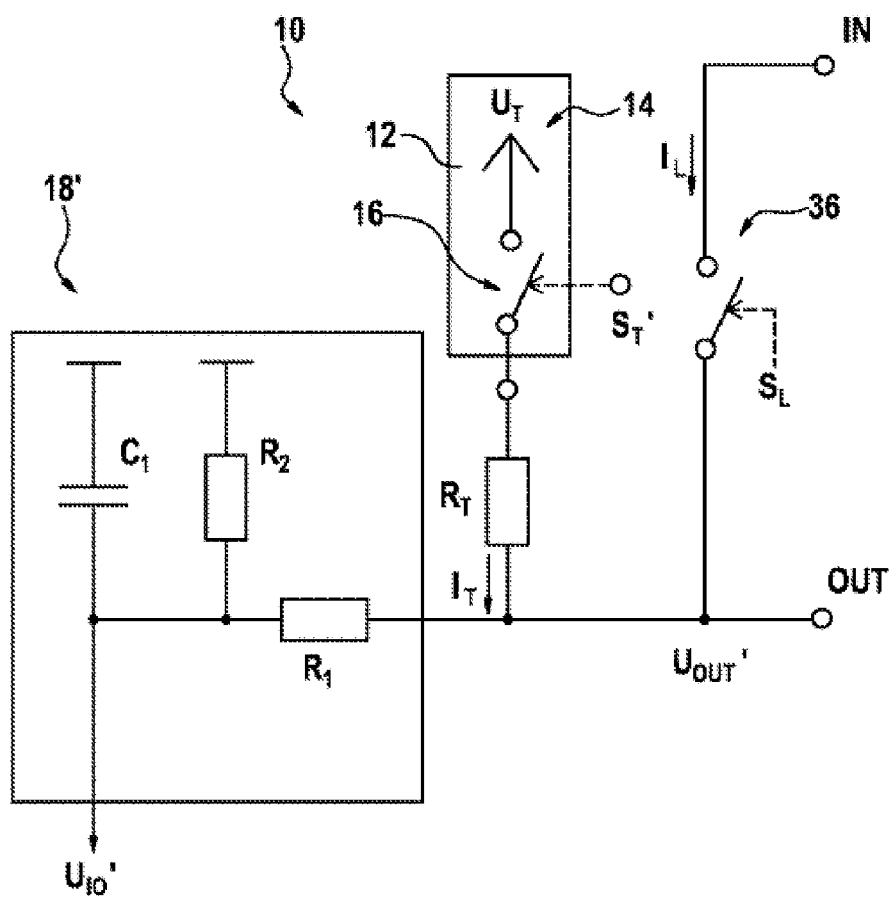
FIG. 2 shows a schematic block diagram of a first exemplary embodiment of a signal conditioning unit for the circuit arrangement according to the invention from FIG. 1.

FIG. 2 shows a detail from the block diagram of the circuit arrangement according to the invention from FIG. 1 with a first exemplary embodiment of the signal conditioning unit 18'. As can be seen from FIG. 2, the signal conditioning unit 18' has a voltage divider $R_1$, $R_2$, $C_1$ with a low-pass filter response, which conditions the voltage $U_{OUT}'$ at the output connection OUT and reduces it to a level that is compatible with the logic of the evaluation and control unit 20, for the purpose of performing a static diagnosis. In a first static diagnosis case, the signal conditioning unit 18' senses the resultant voltage $U_{OUT}'$ at the output connection OUT when the test switch 16 is open, the latter being actuated by the control signal $S_T'$ accordingly, and outputs the corresponding test voltage $U_{IO}'$, conditioned by the voltage divider $R_1$, $R_2$, $C_1$ with the low-pass filter response, to the evaluation and control unit 20 via the interface unit 22 for the purpose of evaluation. In a second static diagnosis case, the signal conditioning unit 18' senses the resultant voltage $U_{OUT}'$ at the output connection OUT when the test switch 16 is closed, the latter being actuated by the control signal $S_T'$ accordingly, with the resultant voltage $U_{OUT}'$ being prompted by a test current $I_T$ which flows through the load 34—which is not shown in FIG. 2. The signal conditioning unit 18' outputs the corresponding test voltage $U_{IO}'$, conditioned by the voltage divider $R_1$, $R_2$, $C_1$ with the low-pass filter response, to the evaluation and control unit 20 via the interface unit 22 for the purpose of evaluation. The evaluation and control unit 20 evaluates the corresponding conditioned test voltage $U_{IO}'$ in both steady diagnosis cases only when a prescribed period of time in the steady state has elapsed. The load switch 36 is open in both steady diagnosis cases.

The evaluation and control unit 20 recognizes a short circuit between the positive pole (+) of the DC voltage source 32 and the output connection OUT of the switchable load 34 when the corresponding conditioned test voltage $U_{IO}'$ has a high level in the first static diagnosis case and in the second static diagnosis case. The evaluation and control unit 20 recognizes an open switchable load 34 or a severed connecting line when the corresponding conditioned test voltage $U_{IO}'$ has different levels in the first static diagnosis case and in the second static diagnosis case. In the case of an open switchable load 34 or in the case of a severed connecting line, an indefinite "floating" voltage actually appears at the output connection OUT in the first diagnosis case. Since the signal conditioning unit 18' typically has a pull-up or pull-down structure, the interface unit 22 can translate the floating voltage into a high logic level in the case of a pull-up structure or into a low logic level in the case of a pull-down structure. In order to recognize the open switchable load 34 or the severed connecting line, the circuit arrangement 10 attempts to route the test current $I_T$ through the switchable load in the second static diagnosis case. If the logic state at the output connection OUT can be changed from the low logic state to the high logic state or from the high logic state to the low logic state in the second static diagnosis case, in comparison with the first static diagnosis case, the evaluation and control unit 20 infers that the switchable load 34 is open or that the connecting line is severed.

The evaluation and control unit 20 recognizes a short circuit between the negative pole (−) of the DC voltage source 32 and the output connection OUT of the switchable load 34 or a nominal inductive switchable load 34 when the corresponding conditioned test voltage $U_{IO}'$ has a low level in the first static diagnosis case and in the second diagnosis case. Without the dynamic diagnosis cases described below, the evaluation and control unit 20 cannot distinguish a flawless load 34 from the short circuit between the output connection OUT and the negative pole (−) of the DC voltage source 32 in the case of an inductive load 34 having a low nonreactive resistance $R_L$ of less than 10Ω. By utilizing the frequency-dependent properties of the switchable inductive load 34, it is possible to recognize the flawless state of the switchable load 34. If a sinusoidal or square-wave AC voltage is applied to the switchable inductive load 34, for example, it is possible to measure or ascertain the frequency-dependent impedance of the switchable inductive load 34. However, it is substantially more beneficial to apply a single square-wave pulse to the switchable inductive load 34 and to evaluate the step response thereof by using a simple conditioning unit 18, 18", as described below with reference to FIGS. 3 to 8.

Figure 3:
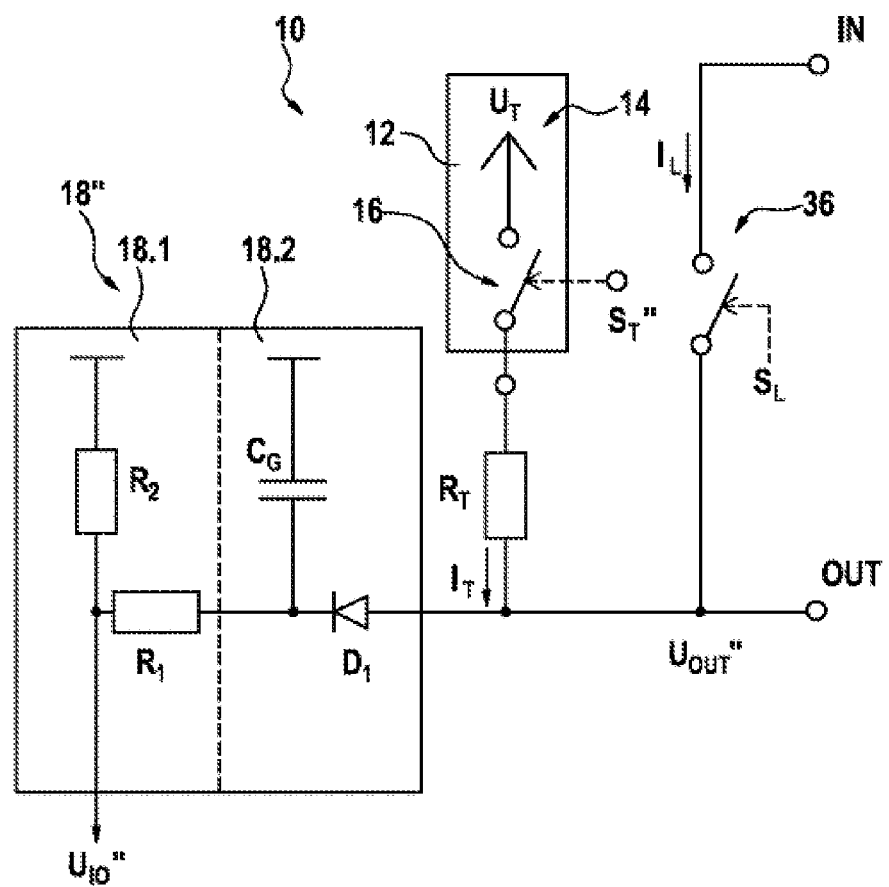
FIG. 3 shows a schematic block diagram of a second exemplary embodiment of a signal conditioning unit for the circuit arrangement according to the invention from FIG. 1.
Figure 6:
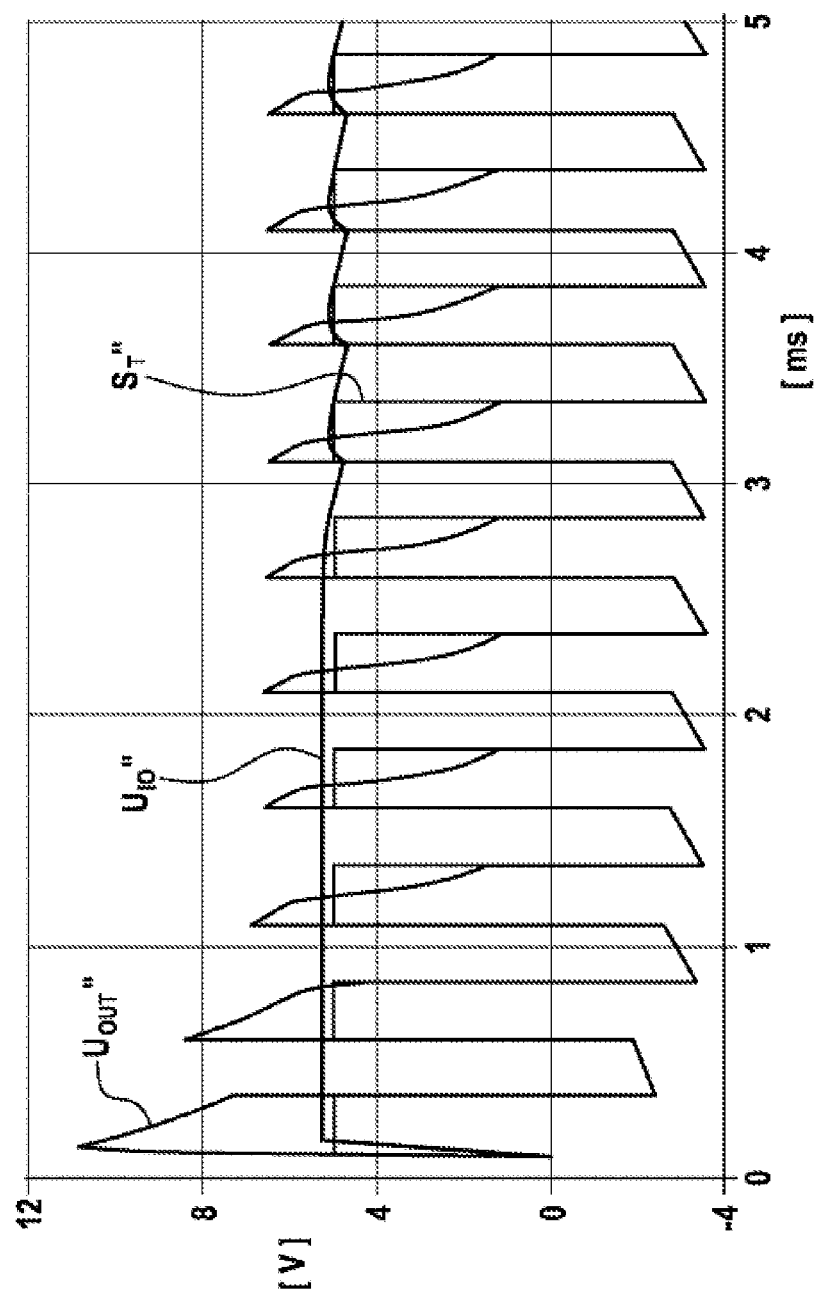
FIG. 6 shows a graph of characteristic curves with a plurality of signals which are measured in a first dynamic diagnosis case in the circuit shown in FIG. 3, the signals presented representing a nominal inductive load as a diagnosis result.
Figure 7:
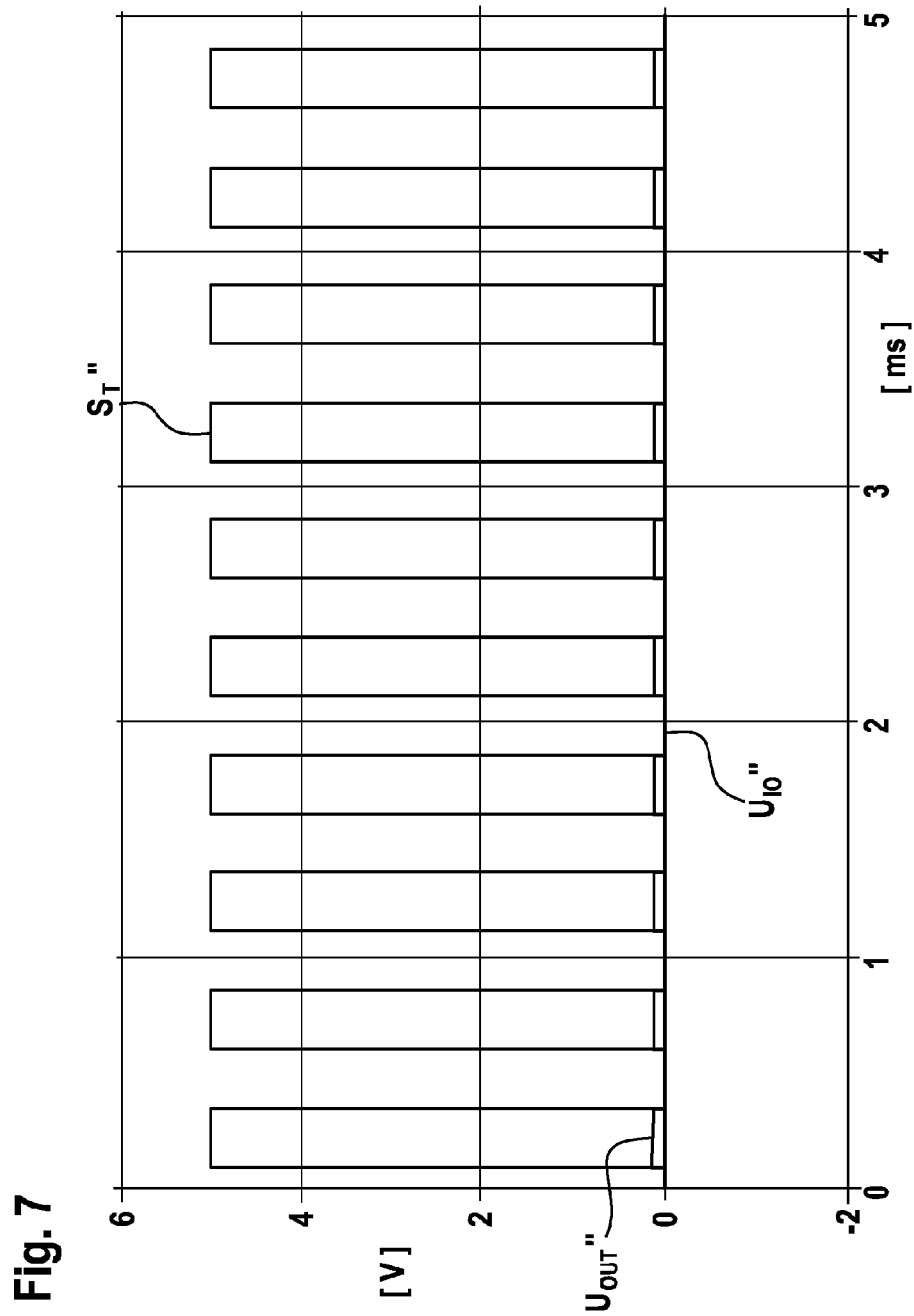
FIG. 7 shows a graph of characteristic curves with a plurality of signals which are measured in a further first dynamic diagnosis case in the circuit shown in FIG. 3, the signals presented representing a short circuit between the output connection and the negative pole of the DC voltage source as a diagnosis result.

FIG. 3 shows a detail from the block diagram of the circuit arrangement according to the invention from FIG. 1 with a second exemplary embodiment of the signal conditioning unit 18". As can be seen from FIG. 3, the right-hand circuit portion 18.2 of the signal conditioning unit 18" has a rectifier with a diode $D_1$ and a smoothing capacitor $C_G$ for the purpose performing a dynamic diagnosis. The signal path downstream of the rectifier $D_1$, $C_G$ in the left-hand circuit portion 18.1 contains a voltage divider with a first resistor $R_1$ and a second resistor $R_2$. In a first dynamic diagnosis case, the test switch 16 is changed over between a closed and an open switching state by the test control signal $S_T''$ at a prescribed frequency, the resultant voltage $U_{OUT}'$ at the output connection OUT being sensed and the corresponding conditioned test voltage $U_{IO}''$ being evaluated for the purpose of ascertaining the frequency response of the resultant voltage $U_{OUT}''$ at the output connection OUT. FIGS. 6 and 7 each show the relevant signal profiles during the first dynamic diagnosis case, with FIG. 6 showing the signal profiles for a flawless switchable inductive load 34 and FIG. 7 showing the signal profiles for a short circuit that is present between the output connection OUT and the negative pole (−) of the DC voltage source. The rectifier $D_1$, $C_G$ means that only positive voltage pulses pass through the diode D1, whereas negative voltage pulses are blocked.

As can be seen from FIG. 6, positive and negative voltage pulses arise as a resultant voltage $U_{OUT}''$ at the output connection OUT in accordance with the switching frequency of the test control signal $S_T''$ in the case of a flawless inductive load 34. The integrating nature of the rectifier arrangement $D_1$, $C_G$ charges the smoothing capacitor $C_G$, and an essentially constant high logic voltage level appears as the test voltage $U_{IO}''$. If a forwarded positive voltage pulse is insufficient to charge the smoothing capacitor $C_G$, it is possible to wait for a prescribed number of voltage pulses until the conditioned test voltage $U_{IO}''$ at the output of the signal conditioning unit 18'' is evaluated. The voltage divider $R_1$, $R_2$ reduces the positive level of the voltage $U_{IO}''$ to a level which is compatible with the logic of the evaluation and control unit 20.

As can be seen from FIG. 7, no or only very small voltage pulses arise as the resultant voltage $U_{OUT}''$ at the output connection OUT in the event of a short circuit between the output connection OUT and the negative pole (−) of the DC voltage source. As a result, a low logic voltage level appears as the test voltage $U_{IO}''$. In summary, the evaluation and control unit 20 recognizes a nominal, i.e. flawless, inductive switchable load 34 in the first dynamic diagnosis case when the corresponding conditioned test voltage $U_{IO}''$ has a high logic level. In the first diagnosis case, the evaluation and control unit 20 recognizes a short circuit between the negative pole (−) of the DC voltage source 32 and the output connection OUT of the switchable load 34 when the corresponding conditioned test voltage $U_{IO}''$ has a low logic level.

Figure 4:
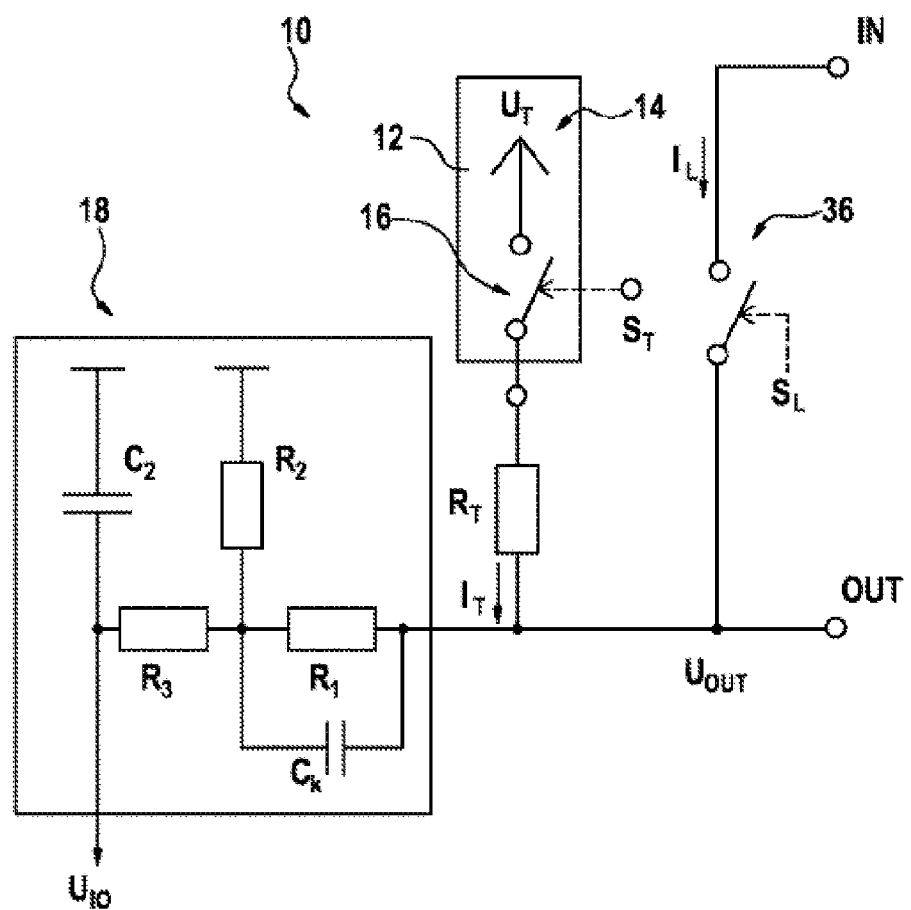
FIG. 4 shows a schematic block diagram of a third exemplary embodiment of a signal conditioning unit for the circuit arrangement according to the invention from FIG. 1.

FIG. 4 shows a detail from the block diagram of the circuit arrangement according to the invention from FIG. 1 with a third exemplary embodiment of the signal conditioning unit 18. As can be seen from FIG. 4, the signal conditioning unit 18 has a voltage divider $R_1$, $R_2$ for the purpose of performing a combined static and dynamic diagnosis, with a coupling capacitor $C_K$ being arranged in parallel with a first resistor $R_1$ of the voltage divider $R_1$, $R_2$, said first resistor being connected to the output connection OUT. In the further signal path, the voltage divider $R_1$, $R_2$ has a low-pass filter $R_3$, $C_2$ arranged downstream of it. The coupling capacitor $C_K$ bypasses the first resistor $R_1$ for voltage pulses, which are forwarded to the low-pass filter $R_3$, $C_2$. The signal conditioning unit 18 for a combined static and dynamic diagnosis is used by the evaluation and control unit 20 to perform first the static diagnosis and then the dynamic diagnosis on the load path 30. In this case, the static diagnosis corresponds to the sequence described with reference to FIG. 3, which means that the two static diagnosis cases are not described in detail again here.

In summary, the static diagnosis by the evaluation and control unit 20 recognizes a short circuit between the positive pole (+) of the DC voltage source 32 and the output connection OUT of the switchable load 34 when the corresponding conditioned test voltage $U_{IO}$ has a high level in the first static diagnosis case and in the second static diagnosis case. The evaluation and control unit 20 recognizes an open switchable load 34 or a severed connecting line when the corresponding conditioned test voltage $U_{IO}$ has different levels in the first static diagnosis case and in the second static diagnosis case. The evaluation and control unit 20 recognizes a short circuit between the negative pole (−) of the DC voltage source 32 and the output connection OUT of the switchable load 34 or a nominal inductive switchable load 34 when the corresponding conditioned test voltage $U_{IO}$ has a low level in the first static diagnosis case and in the second static diagnosis case. Without the dynamic diagnosis cases described below, the evaluation and control unit 20 cannot distinguish a flawless load 34 from the short circuit between the output connection OUT and the negative pole (−) of the DC voltage source 32 in the case of an inductive load 34 with a low nonreactive resistance $R_L$ of less than 10Ω.

Figure 8:
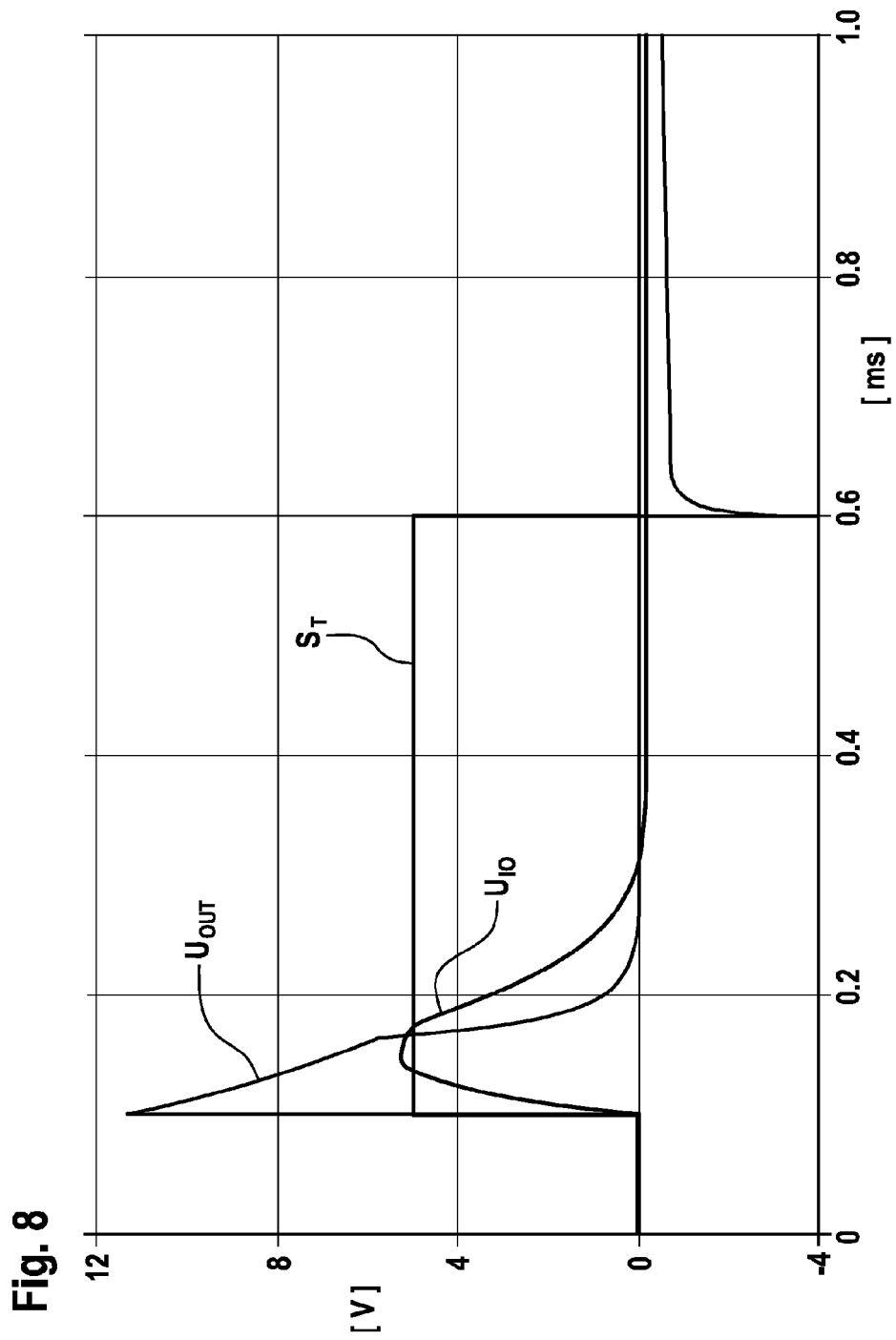
FIG. 8 shows a graph of characteristic curves with a plurality of signals which are measured in a second dynamic diagnosis case in the circuit shown in FIG. 4, the signals presented representing a nominal inductive load as a diagnosis result.
Figure 9:
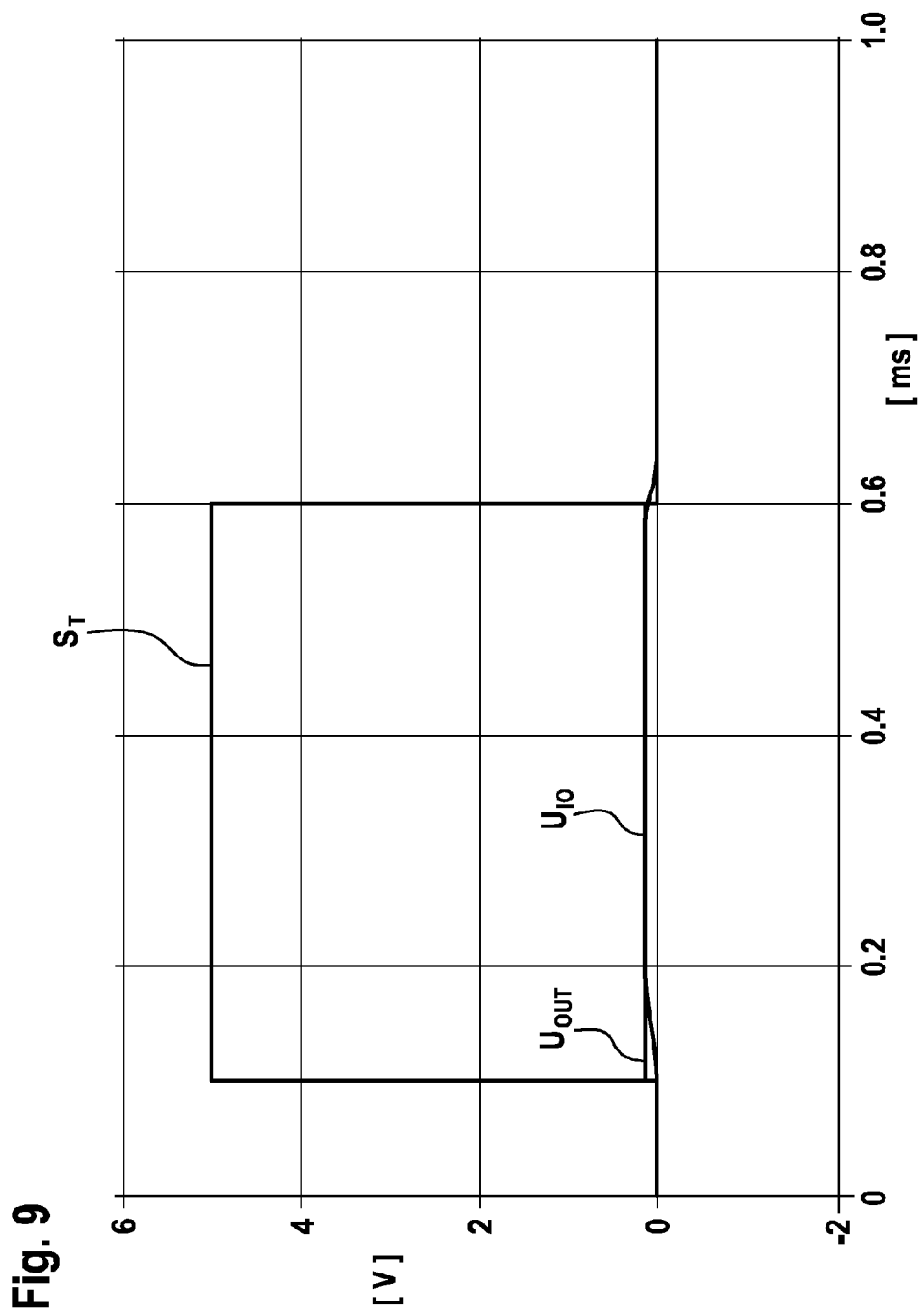
FIG. 9 shows a graph of characteristic curves with a plurality of signals which are measured in a further second dynamic diagnosis case in the circuit shown in FIG. 3, the signals presented representing a short circuit between the output connection and the negative pole of the DC voltage source as a diagnosis result.

Following the static diagnosis, the switching state of the test switch 16 is changed over from the open state to the closed state in a second dynamic diagnosis case by the test control signal $S_T$ for a prescribed period of time. The resultant voltage $U_{OUT}$ is sensed at the output connection OUT and is conditioned by the signal conditioning unit 18 and output to the evaluation and control unit 20 as a corresponding conditioned test voltage $U_{IO}$ for the purpose of evaluating and ascertaining the frequency response of the switchable load 34 at the output connection OUT. FIGS. 8 and 9 each show the relevant signal profiles during the second dynamic diagnosis case, with FIG. 8 showing the signal profiles for a flawless switchable inductive load 34 and FIG. 9 showing the signal profiles for a short circuit that is present between the output connection OUT and the negative pole (−) of the DC voltage source. Since the resistance value of the test resistance $R_T$ is very much higher than the sum of the resistance values of the load resistance $R_L$ and the equivalent resistance $R_W$, the time constant is determined essentially by the inductance L and the test resistance $R_T$.

As can be seen from FIG. 8, an appropriate positive voltage pulse and an appropriate negative voltage pulse arise as a resultant voltage $U_{OUT}$ at the output connection OUT when there is a flawless inductive load 34 at the switching transitions in the test control signal $S_T$. The time constant means that the voltage pulse in the resultant voltage $U_{OUT}$ at the output connection OUT which is brought about by the closure of the test switch 16 is substantially larger and wider than the voltage pulse which is brought about by the opening of the test switch 16. Even without a rectifier, the different voltage pulses result in a positive voltage difference on the low-pass filter $R_3$, $C_2$ and in the step response shown as a resultant voltage $U_{OUT}$ at the output connection OUT or as a conditioned test voltage $U_{IO}$ at the output of the signal conditioning unit 18. The evaluation and control unit 20 performs the evaluation of the conditioned test voltage $U_{IO}$ within the prescribed period of time briefly after the test switch 16 is changed over, in order to be able to sense the positive voltage pulse. Hence, the evaluation and control unit 20 recognizes a nominal inductive switchable load 34 in the second dynamic diagnosis case when the conditioned test voltage $U_{IO}$ has a positive pulse after the test switch 16 has been closed within the prescribed period of time. In the second dynamic diagnosis case, the evaluation and control unit 20 recognizes a short circuit between the negative pole (−) of the DC voltage source 32 and the output connection OUT of the switchable load 34 when the corresponding conditioned test voltage $U_{IO}$ has a low level during the prescribed period of time irrespective of the switching state of the test switch 16.

As can be seen from FIG. 9, no or only very small voltage pulses arise as a resultant voltage $U_{OUT}$ at the output connection OUT in the event of a short circuit between the output connection OUT and the negative pole (−) of the DC voltage source. As a result, a low logic voltage level appears as the conditioned test voltage $U_{IO}$. In summary, the evaluation and control unit 20 recognizes a nominal, i.e. flawless, inductive switchable load 34 in the second dynamic diagnosis case when the corresponding conditioned test voltage $U_{IO}$ has a positive voltage pulse. In the second diagnosis case, the evaluation and control unit 20 recognizes a short circuit between the negative pole (−) of the DC voltage source 32 and the output connection OUT of the switchable load 34 when the corresponding conditioned test voltage $U_{IO}$ has a low logic level.

Figure 5:
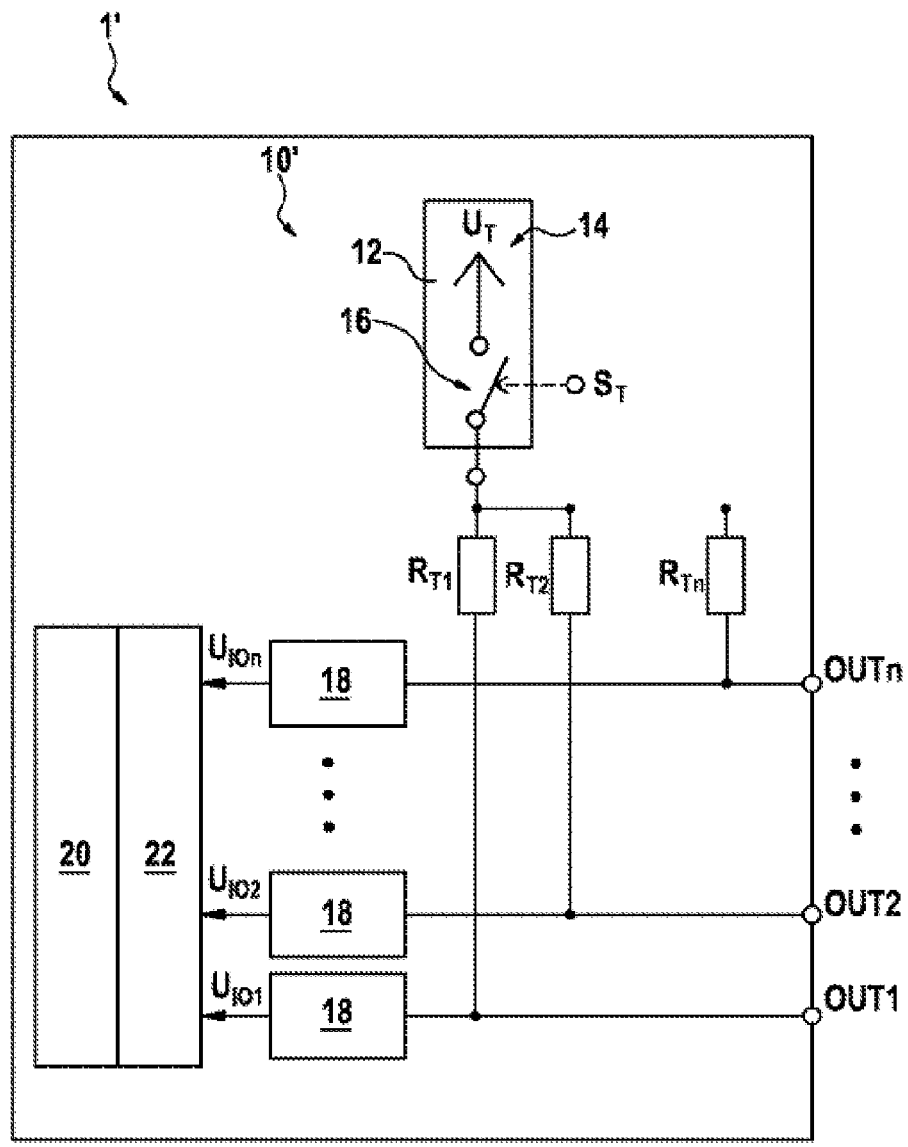
FIG. 5 shows a schematic block diagram of an exemplary embodiment of a circuit arrangement according to the invention for diagnosis on a plurality of load paths.

FIG. 5 shows a schematic block diagram of an exemplary embodiment of a circuit arrangement 1' according to the invention for diagnosis on a plurality of load paths. As can be seen from FIG. 5, for the purpose of diagnosis on a plurality of load paths which are each connected to an output connection OUT1, OUT2, OUTn, the circuit arrangement 10' comprises a test voltage source 12 and, for each output connection OUT1, OUT2, OUTn, a test resistance $R_{T1}$, $R_{T2}$, $R_{Tn}$ and a signal conditioning unit 18. The signal conditioning units 18 condition the respective voltage at the corresponding output connection OUT1, OUT2, OUTn and each output a corresponding conditioned test voltage $U_{IO1}$, $U_{IO2}$, $U_{IOn}$ to an evaluation and control unit 20 via an interface unit 22 for the purpose of evaluation. The diagnosis on the individual load paths takes place on the basis of the execution of the signal conditioning unit 18 in accordance with the explanations above.

In order to avoid malfunctions during the diagnosis on the at least one load path, the at least one test resistance $R_T$, $R_{T1}$, $R_{T2}$, $R_{T3}$ and the resistances $R_1$, $R_2$, $R_3$ in the various signal conditioning units 18, 18', 18" are attuned to one another such that the test current $I_T$ does not exceed a prescribed threshold value in order to prevent the switchable load 34 from being activated.

In line with the method according to the invention for diagnosis on a load path in a vehicle, which load path comprises a DC voltage source 32, a switchable load 34 that is permanently connected to a negative pole (−) and a load switch 36 that is permanently connected to a positive pole (+) and that can be controlled by means of a load control signal $S_L$, wherein in the closed state of the load switch 36 it is possible for a load current $I_L$ to be carried by the switchable load 34, a test current $I_T$ having a defined level is produced during the diagnosis and is output to the switchable load 34 by means of a test switch 16 at an output connection OUT on the basis of a test control signal $S_T$, wherein a resultant voltage $U_{OUT}$, $U_{OUT}'$, $U_{OUT}''$ at the output connection OUT is sensed, conditioned and evaluated, wherein the load switch 36 is opened during the diagnosis, and wherein the test control signal $S_T$ and the resultant switching state of the test switch 16 are used to produce at least two different diagnosis cases.

The invention claimed is:

1. A method for diagnosis of a load path in a vehicle, wherein the load path (30) comprises a DC voltage source (32), a switchable load (34) that is permanently connected to a negative pole (−) and a load switch (36) that is permanently connected to a positive pole (+) and that is controlled by a load control signal ($S_L$), wherein when the load switch (36) is in the closed state a load current ($I_L$) is carried by the switchable load (34), characterized in that during the diagnosis a switchable test current ($I_T$) having a defined level is produced and is output to the switchable load (34) via a test switch (16) at an output connection (OUT) on the basis of a test control signal ($S_T$), wherein a resultant voltage ($U_{OUT}$, $U_{OUT}'$, $U_{OUT}''$) at the output connection (OUT) is sensed, conditioned and evaluated, wherein the load switch (36) is opened during the diagnosis, and wherein the test control signal ($S_T$) and the resultant switching state of the test switch (16) are used to produce at least two different diagnosis cases, wherein the diagnosis includes both static and dynamic cases, and wherein, in order to recognize and distinguish between different load path states, the static and dynamic cases are combined, wherein in a first static diagnosis case the resultant voltage ($U_{OUT}$, $U_{OUT}'$, $U_{OUT}''$) at the output connection (OUT) is sensed when the test switch (16) is open, and the corresponding conditioned test voltage ($U_{IO}$, $U_{IO}'$, $U_{IO}''$, $U_{IO1}$, $U_{IO2}$, $U_{IOm}$) is evaluated, and in a second static diagnosis case the resultant voltage ($U_{OUT}$, $U_{OUT}'$, $U_{OUT}''$) at the output connection (OUT) is sensed when the test switch (16) is closed, and the corresponding conditioned test voltage ($U_{IO}$, $U_{IO',UIO}''$, $U_{IO1}$, $U_{IO2}$, $U_{IOn}$) is evaluated, wherein the conditioned test voltage ($U_{IO}$, $U_{IO}'$, $U_{IO}''$, $U_{IO1}$, $U_{IO2}$, $U_{IOn}$) is only evaluated after a prescribed period of time in the steady state has elapsed, characterized in that a nominal inductive switchable load (34) is recognized when the corresponding conditioned test voltage ($U_{IO}$, $U_{IO}'$, $U_{IO}''$, $U_{IO1}$, $U_{IO2}$, $U_{IOn}$) has a low level in the first static diagnosis case and in the second static diagnosis case.

2. The method as claimed in claim 1, characterized in that in a first dynamic diagnosis case the test switch (16) is changed between a closed and an open switching state by the test control signal ($S_T$) at a prescribed frequency, wherein the resultant voltage ($U_{OUT}$, $U_{OUT}'$, $U_{OUT}''$) at the output connection (OUT) is sensed and the corresponding conditioned test voltage ($U_{IO}$, $U_{IO}'$, $U_{IO}''$, $U_{IO1}$, $U_{IO2}$, $U_{IOn}$) is evaluated for the purpose of ascertaining the frequency response of the switchable load (34) at the output connection (OUT).

3. The method as claimed in claim 1, characterized in that in a second dynamic diagnosis case the test switch (16) is closed and opened again at least once within a prescribed period of time, wherein the resultant voltage ($U_{OUT}$, $U_{OUT}'$, $U_{OUT}''$) at the output connection (OUT) is sensed and the corresponding conditioned test voltage ($U_{IO}$, $U_{IO}'$, $U_{IO}''$, $U_{IO1}$, $U_{IO2}$, $U_{IOn}$) is evaluated within the prescribed period of time for the purpose of ascertaining the step response behavior of the switchable load (34) at the output connection (OUT).

4. The method as claimed in claim 1, characterized in that a short circuit between the positive pole (+) of the DC voltage source and the output connection (OUT) of the switchable load is recognized when the corresponding conditioned test voltage ($U_{IO}$, $U_{IO}'$, $U_{IO}''$, $U_{IO1}$, $U_{IO2}$, $U_{IOn}$) has a high level in the first static diagnosis case and in the second static diagnosis case and/or an open switchable load (34) is recognized when the corresponding conditioned test voltage ($U_{IO}$, $U_{IO}'$, $U_{IO}''$, $U_{IO1}$, $U_{IO2}$, $U_{IOn}$) has different levels in the first static diagnosis case and in the second static diagnosis case.

5. The method as claimed in claim 1, characterized in that a short circuit between the negative pole (−) of the DC voltage source and the output connection (OUT) of the switchable load is recognized when the corresponding conditioned test voltage ($U_{IO}$, $U_{IO}'$, $U_{IO}''$, $U_{IO1}$, $U_{IO2}$, $U_{IOn}$ has a low level in the first static diagnosis case and in the second static diagnosis case.

6. The method as claimed in claim 5, characterized in that a nominal inductive switchable load (34) is recognized when the corresponding conditioned test voltage ($U_{IO}$, $U_{IO}'$, $U_{IO}''$, $U_{IO1}$, $U_{IO2}$, $U_{IOn}$) has a high level in the first dynamic diagnosis case or when the corresponding conditioned test voltage ($U_{IO}$, $U_{IO}'$, $U_{IO}''$, $U_{IO1}$, $U_{IO2}$, $U_{IOn}$) has a positive pulse in the second dynamic diagnosis case following the closure of the test switch (16) within the prescribed period of time, wherein a short circuit between the negative pole (−) of the DC voltage source (32) and the output connection (OUT) of the switchable load (34) is recognized when the corresponding conditioned test voltage ($U_{IO}$, $U_{IO}'$, $U_{IO}''$, $U_{IO1}$, $U_{IO2}$, $U_{IOn}$) has a low level in the first dynamic diagnosis case or when the corresponding conditioned test voltage ($U_{IO}$, $U_{IO}'$, $U_{IO}''$, $U_{IO1}$, $U_{IO2}$, $U_{IOn}$) has a low level in the second dynamic diagnosis case during the prescribed period of time irrespective of the switching state of the test switch (16).

7. A circuit arrangement for diagnosis on a load path in a vehicle, wherein the load path (30) comprises a DC voltage source (32), a switchable load (34) that is permanently connected to a negative pole (−) and a load switch (36) that is permanently connected to a positive pole (+) and that is controlled by a load control signal ($S_L$), wherein in the closed state of the load switch (36) a load current ($I_L$) is carried by the switchable load (34), characterized by at least one test voltage source (12), which comprises a voltage source (14) and a test switch (16) controlled by a test control signal ($S_T$) and is embodied such that during the diagnosis at least one test resistance ($R_T$, $R_{T1}$, $R_{T2}$, $R_{T3}$) to be used to produce a test current ($I_T$) having a defined level and to output said test current to the switchable load (34) at an output connection (OUT), and a signal conditioning unit (18, 18', 18'') which, during the diagnosis, senses a resultant voltage ($U_{OUT}$, $U_{OUT}'$, $U_{OUT}''$) at the output connection (OUT) and outputs a conditioned test voltage ($U_{IO}$, $U_{IO}'$, $U_{IO}''$, $U_{IO1}$, $U_{IO2}$, $U_{IOn}$) to an evaluation and control unit (20) for the purpose of evaluation, wherein the load switch (36) is open during the diagnosis, and wherein the test control signal ($S_T$) and the resultant switching state of the test switch (16) produces at least two different diagnosis cases, characterized in that the signal conditioning unit (18) has a voltage divider ($R_1$, $R_2$) for the purpose of performing a combined static and dynamic diagnosis wherein a coupling capacitor ($C_K$) is arranged in parallel with a first resistor $R_1$) of the voltage divider ($R_1$, $R_2$), which resistor is connected to the output connection (OUT), and wherein the signal path downstream of the voltage divider ($R_1$, $R_2$) contains a low-pass filter ($R_3$, $C_2$).

8. The circuit arrangement as claimed in claim 7, characterized in that the signal conditioning unit (18') has a voltage divider ($R_1$, $R_2$, $C_1$) with a low-pass filter response for the purpose of performing a static diagnosis.

9. The circuit arrangement as claimed in claim 7, characterized in that the signal conditioning unit (18'') has a rectifier ($D_1$, $C_G$) for the purpose of performing a dynamic diagnosis.

10. The circuit arrangement as claimed in claim 9, characterized in that the signal path downstream of the rectifier ($D_1$, $C_G$) contains a voltage divider ($R_1$, $R_2$).

11. The circuit arrangement as claimed in claim 7, characterized in that the evaluation and control unit performs the static diagnosis and then the dynamic diagnosis on the load path.

12. The circuit arrangement as claimed in claim 7, characterized in that the at least one test resistance ($R_T$, $R_{T1}$, $R_{T2}$, $R_{T3}$) and the resistance ($R_1$, $R_2$, $R_3$) in the signal conditioning unit (18, 18', 18'') are attuned to one another such that the test current ($I_T$) does not exceed a prescribed threshold value in order to prevent the switchable load (34) from being activated.

\* \* \* \* \*